(12) United States Patent
Lo et al.

(10) Patent No.: US 11,744,050 B2
(45) Date of Patent: Aug. 29, 2023

(54) REDUNDANT COOLING MODULE FOR AN AUTONOMOUS VEHICLE COMPUTER

(71) Applicant: GM Cruise Holdings LLC, San Francisco, CA (US)

(72) Inventors: Roger Lo, San Francisco, CA (US); Brian Schlotterbeck, San Francisco, CA (US)

(73) Assignee: GM Cruise Holdings LLC, San Francisco, CA (US)

(*) Notice: Subject to any disclaimer, the term of this patent is extended or adjusted under 35 U.S.C. 154(b) by 66 days.

(21) Appl. No.: 17/479,753

(22) Filed: Sep. 20, 2021

(65) Prior Publication Data

US 2022/0007550 A1    Jan. 6, 2022

Related U.S. Application Data

(63) Continuation of application No. 16/876,681, filed on May 18, 2020, now Pat. No. 11,153,994.

(51) Int. Cl.
*H05K 7/20* (2006.01)
*F01P 3/12* (2006.01)
*F28D 9/00* (2006.01)

(52) U.S. Cl.
CPC .......... *H05K 7/20872* (2013.01); *F01P 3/12* (2013.01); *H05K 7/20263* (2013.01); *H05K 7/20272* (2013.01); *F01P 2060/00* (2013.01); *F28D 9/0093* (2013.01)

(58) Field of Classification Search
CPC .......... H05K 7/20218; H05K 7/20254; H05K 7/20263; H05K 7/20272; H05K 7/20872; F01P 3/12; F01P 2060/00; F28D 9/0093
See application file for complete search history.

(56) References Cited

U.S. PATENT DOCUMENTS

| | | | |
|---|---|---|---|
| 6,213,194 B1 * | 4/2001 | Chrysler | F25B 41/20 257/722 |
| 7,808,783 B2 * | 10/2010 | Goth | G06F 1/206 361/699 |
| 2019/0351732 A1 * | 11/2019 | Rajaie | B60H 1/3227 |
| 2020/0198440 A1 * | 6/2020 | Straub | H05K 7/20254 |

* cited by examiner

*Primary Examiner* — Zachary Pape
(74) *Attorney, Agent, or Firm* — Novak Druce Carroll LLP (57) ABSTRACT

Systems, methods, and computer-readable media are disclosed. An example coolant system can be configured in an autonomous vehicle. The system can include a first coolant loop configured with a first series of coolant hoses to communicate a first volume of coolant fluid between a first reservoir, a first coolant pump, a three-way heat exchanger, and a computer system heat exchanger and a second coolant loop configured with a second series of coolant hoses to communicate a second volume of coolant fluid between a second reservoir, a second coolant pump, the three way heat exchanger, and the computer system heat exchanger. The system can further include a third coolant loop configured with a third series of coolant hoses to communicate third volume of coolant fluid between the three-way heat exchanger and an engine heat exchanger of the vehicle.

20 Claims, 9 Drawing Sheets

FIG. 7

REDUNDANT COOLING MODULE FOR AN AUTONOMOUS VEHICLE COMPUTER

CROSS-REFERENCE TO RELATED APPLICATIONS

This application is a continuation of U.S. application Ser. No. 16/876,681, filed on May 18, 2020, entitled, REDUNDANT COOLING MODULE FOR AN AUTONOMOUS VEHICLE COMPUTER, which is hereby expressly incorporated by reference in its entirety.

FIELD OF THE INVENTION

The present technology pertains to autonomous vehicles and more specifically to a redundant thermal management system that provides two independent flows of coolant to a computer system to maintain functionality of the computer system.

BACKGROUND

Autonomous vehicle computers implement high-powered computer chips that create kilowatts of heat power. The functionality and integrity of these chips are very sensitive to temperature. In order to maintain a highly reliable autonomous vehicle computer system, a proper thermal management system needs to be in place. While most automotive vehicle computers have some kind of heat spreader, cold plate or heat sink design, they still require a method of actively moving the heat away from the local areas around the hot chips to outside the vehicle. In order to prevent failure of the computer systems, which can cause an autonomous vehicle to crash, it is important to maintain the proper temperature for the on-board computer systems.

BRIEF DESCRIPTION OF THE DRAWINGS

In order to describe the manner in which the above-recited and other advantages and features of the disclosure can be obtained, a more particular description of the principles briefly described above will be rendered by reference to specific embodiments thereof which are illustrated in the appended drawings. Understanding that these drawings depict only exemplary embodiments of the disclosure and are not therefore to be considered to be limiting of its scope, the principles herein are described and explained with additional specificity and detail through the use of the accompanying drawings in which.

DESCRIPTION OF EXAMPLE EMBODIMENTS

Various example embodiments of the disclosure are discussed in detail below. While specific implementations are discussed, it should be understood that this is done for illustration purposes only. A person skilled in the relevant art will recognize that other components and configurations may be used without parting from the spirit and scope of the disclosure. Thus, the following description and drawings are illustrative and are not to be construed as limiting. Numerous specific details are described to provide a thorough understanding of the disclosure. However, in certain instances, well-known or conventional details are not described in order to avoid obscuring the description. References to one or an embodiment in the present disclosure can be references to the same embodiment or any embodiment; and, such references mean at least one of the example embodiments.

Reference to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative example embodiments mutually exclusive of other example embodiments. Moreover, various features are described which may be exhibited by some example embodiments and not by others.

The terms used in this specification generally have their ordinary meanings in the art, within the context of the disclosure, and in the specific context where each term is used. Alternative language and synonyms may be used for any one or more of the terms discussed herein, and no special significance should be placed upon whether or not a term is elaborated or discussed herein. In some cases, synonyms for certain terms are provided. A recital of one or more synonyms does not exclude the use of other synonyms. The use of examples anywhere in this specification including examples of any terms discussed herein is illustrative only, and is not intended to further limit the scope and meaning of the disclosure or of any example term. Likewise, the disclosure is not limited to various example embodiments given in this specification.

Without intent to limit the scope of the disclosure, examples of instruments, apparatus, methods and their related results according to the example embodiments of the present disclosure are given below. Note that titles or subtitles may be used in the examples for convenience of a reader, which in no way should limit the scope of the disclosure. Unless otherwise defined, technical and scientific terms used herein have the meaning as commonly understood by one of ordinary skill in the art to which this disclosure pertains. In the case of conflict, the present document, including definitions will control.

Additional features and advantages of the disclosure will be set forth in the description which follows, and in part will be obvious from the description, or can be learned by practice of the herein disclosed principles. The features and advantages of the disclosure can be realized and obtained by means of the instruments and combinations particularly pointed out in the appended claims. These and other features of the disclosure will become more fully apparent from the following description and appended claims, or can be learned by the practice of the principles set forth herein.

For clarity of explanation, in some instances the present technology may be presented as including individual functional blocks including functional blocks comprising devices, device components, steps or routines in a method embodied in software or other physical steps, or combinations of hardware and software.

Overview

The present disclosure addresses the issue raised above with respect to an improvement in proper thermal management of autonomous vehicle computer systems. The present disclosure addresses the need by including pumps that push coolant fluid into the computer cold plate or heat exchange mechanism and back out into a heat exchanger that can interface with standard vehicle cooling systems, such as a battery cooling loop. In addition, the heat exchanger ensures that the computer coolant is separate from the vehicle coolant, which is usually unfiltered and can cause blockages inside computer cold plates. The redundant cooling aspect of this disclosure increases the safety of this module and ensures that there is no single point of failure within the cooling infrastructure that can damage the computer systems due to overheating.

The disclosed cooling module includes two coolant fluid reservoirs and autonomous coolant pumps. The pumps are mounted to a custom bracket that ensures that the subcomponents are held stiff in a vehicle which protects them from large displacement vibrations from the vehicle during driving. The bracket also holds a custom three-way liquid-to-liquid heat exchanger. This heat exchanger in one example can be a custom stack plate aluminum brazed design and allows two independent hot fluid loops to be cooled by a single cold fluid loop or through other heat exchange structures.

In one example, a design of ten custom hoses allows for coolant fluid to traverse between the components to the computer coolant ports and to the vehicle level cooling system. Dry-break quick disconnects are attached to the ends of the coolant hoses that connect to the computer system, which allows for the removal of the modules from the computer without the need to drain the fluid. Other metal, other materials and structure can be used for the three-way heat exchanger as well.

The three-way heat exchanger is a custom design that serves a novel use case of interfacing a redundant cooling loop system with a single cooling loop associated with a vehicle engine. The use of two reservoirs and two pumps to create two separate cooling loops is a novel structure for increasing the safety of an autonomous vehicle computer system cooling use case.

An example coolant system includes a first coolant loop configured with a first series of coolant hoses to communicate a first volume of coolant fluid between a first reservoir, a first coolant pump, a three-way heat exchanger, and a computer system heat exchanger. The system includes a second coolant loop configured with a second series of coolant hoses to communicate a second volume of coolant fluid between a second reservoir, a second coolant pump, the three-way heat exchanger, and the computer system heat exchanger. The system can also include a third coolant loop configured with a third series of coolant hoses to communicate a third volume of coolant fluid between the three-way heat exchanger and an engine heat exchanger of the vehicle. In one aspect, the vehicle is an autonomous vehicle.

An example method includes providing a first coolant loop having a first series of coolant hoses which connect a first reservoir, a first coolant pump, a three-way heat exchanger, and a computer system heat exchanger and providing a second coolant loop having a second series of coolant hoses which connect a second reservoir, a second coolant pump, the three-way heat exchanger, and the computer system heat exchanger. The method can also include providing a third coolant loop having a third series of coolant hoses which connect the three-way heat exchanger to a vehicle engine heat exchanger and distributing a first volume of coolant fluid through the first coolant loop and distributing a second volume of coolant fluid through the second coolant loop. The method can further include distributing a third volume of coolant fluid through the third coolant loop.

In another example, a computer system of the vehicle can include a processor and a computer system heat exchanger in thermal communication with the processor. The computer system heat exchanger can be configured to exchange heat from the processor with one or both of a first coolant fluid loop and a second coolant fluid loop, wherein if one of the first coolant fluid loop and the second coolant fluid loop are no longer operational resulting in a remaining operational coolant fluid, the computer system heat exchanger can continue to exchange the heat from the processor with the remaining operational coolant fluid loop. The first coolant fluid loop and the second coolant fluid loop can be associated with a three-way heat exchanger that cools fluid associated with the computer system and cools vehicle coolant fluid from a vehicle engine coolant loop.

DETAILED DESCRIPTION

Generally, this disclosure relates to an autonomous vehicle and a cooling system for the computing components of the vehicle. Accordingly, this disclosure first generally introduces an autonomous vehicle and then follows with the description of the cooling system.

Figure 1:
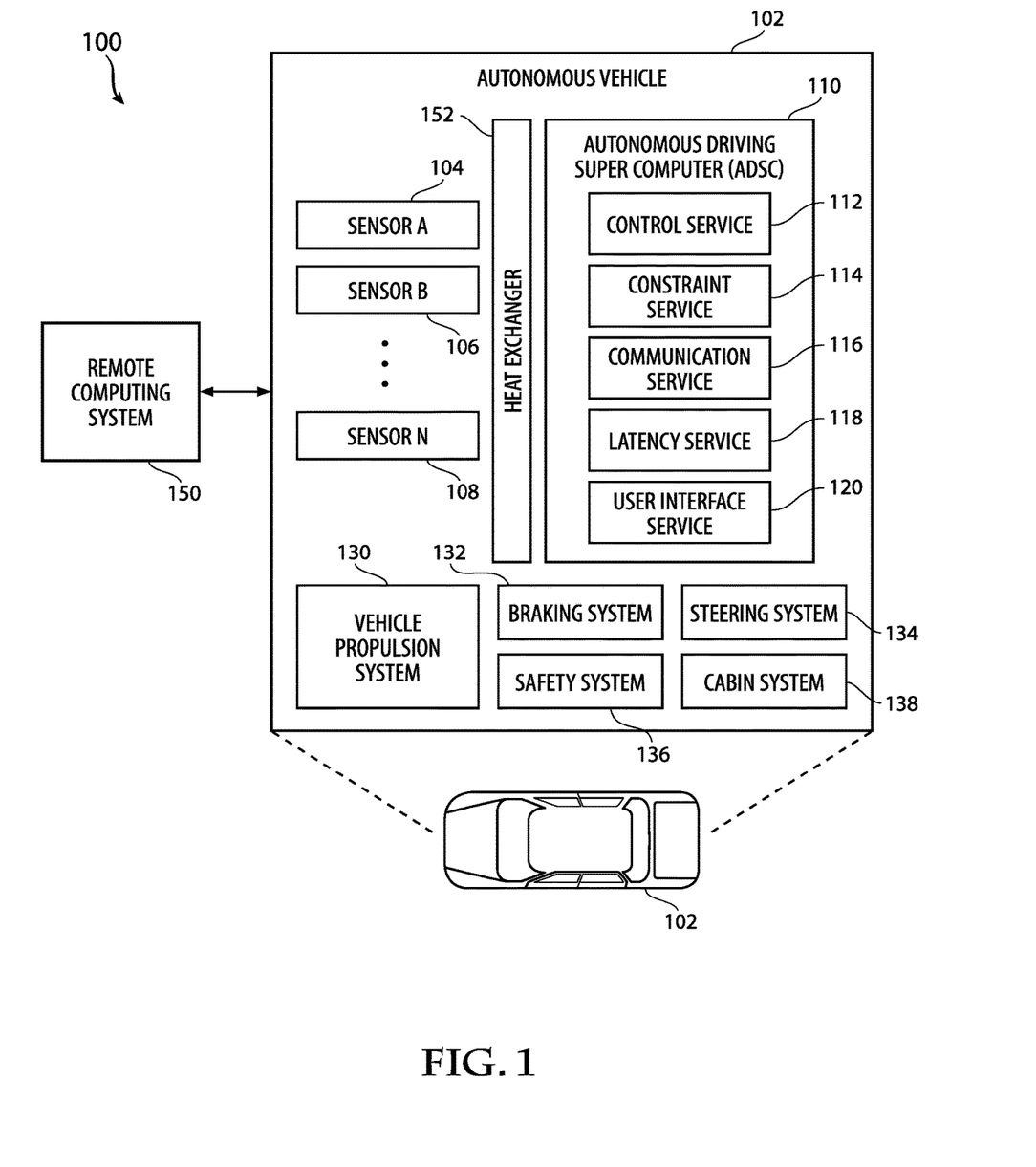
FIG. 1 illustrates an example autonomous vehicle environment including a computing system, in accordance with some examples.

FIG. 1 illustrates an example autonomous vehicle environment 100. The example autonomous vehicle environment 100 includes an autonomous vehicle 102 with various component, some of which need cooling as introduced above. The autonomous vehicle 102 can communicate with a remote computing system 150 over one or more networks, such as a public network (e.g., a public cloud, the Internet, etc.), a private network (e.g., a local area network, a private cloud, a virtual private network, etc.), and/or a hybrid network (e.g., a multi-cloud or hybrid cloud network, etc.).

The autonomous vehicle 102 can navigate about roadways without a human driver based on sensor signals generated by sensors 104-108 on the autonomous vehicle 102. The sensors 104-108 on the autonomous vehicle 102 can include one or more types of sensors and can be arranged about the autonomous vehicle 102. For example, the sensors 104-108 can include, without limitation, one or more inertial measuring units (IMUs), one or more image sensors (e.g., visible light image sensors, infrared image sensors, video camera sensors, surround view camera sensors, etc.), one or more light emitting sensors, one or more global positioning system (GPS) devices, one or more radars, one or more light detection and ranging sensors (LIDARs), one or more sonars, one or more accelerometers, one or more gyroscopes, one or more magnetometers, one or more altimeters, one or more tilt sensors, one or more motion detection sensors, one or more light sensors, one or more audio sensors, etc. In some implementations, sensor 104 can be a radar, sensor 106 can be a first image sensor (e.g., a visible light camera), and sensor 108 can be a second image sensor (e.g., a thermal camera). Other implementations can include any other number and type of sensors. Any one or more of the sensors can be considered as the "computing system" described herein which needs to have heat drawn away from it to maintain its performance.

The autonomous vehicle 102 can include several mechanical systems that are used to effectuate motion of the autonomous vehicle 102. For instance, the mechanical systems can include, but are not limited to, a vehicle propulsion system 130, a braking system 132, and a steering system 134. The vehicle propulsion system 130 can include an electric motor, an internal combustion engine, or both. The system 130 can include any machine configured to convert one form of energy into mechanical energy or any combination of engines. For example, it could be an electric motor and a combustion engine working together to provide propulsion. The braking system 132 can include an engine brake, brake pads, actuators, and/or any other suitable componentry configured to assist in decelerating the autonomous vehicle 102. The steering system 134 includes suitable componentry configured to control the direction of movement of the autonomous vehicle 102 during navigation.

The autonomous vehicle 102 can include a safety system 136. The safety system 136 can include lights and signal indicators, a parking brake, airbags, etc. The autonomous vehicle 102 can also include a cabin system 138, which can include cabin temperature control systems, in-cabin entertainment systems, etc.

The autonomous vehicle 102 can include an autonomous driving super computer (ADSC) 110 in communication with the sensors 104-108 and the systems 130, 132, 134, 136, and 138. The ADSC 110 can include one or more internal computers and/or computing systems. Moreover, the ADSC 110 can include one or more compute components or processors such as, for example, one or more central processing units (CPUs), one or more graphics processing units (GPUs), one or more digital signal processors (DSPs), one or more image signal processors (ISPs), one or more Intellectual Property (IP) cores, one or more microprocessors, etc. The ADSC 110 can also include one or more hardware components and/or electronic circuits such as, for example, one or more field-programmable gate arrays (FPGAs), one or more application-specific integrated circuits (ASICs), one or more storage devices, one or more memory devices, one or more communications devices (e.g., network interface card (NIC), wireless MC, antenna, etc.), one or more sensors (e.g., image or camera sensor, radar sensor, LIDAR sensor, etc.), one or more GPS devices, etc.

In some examples, the ADSC 110 includes one or more processors and at least one memory for storing instructions executable by the one or more processors. The computer-executable instructions can make up one or more services for controlling the autonomous vehicle 102, communicating with remote computing system 150, receiving inputs from passengers or human co-pilots, logging metrics regarding data collected by sensors 104-108 and human co-pilots, etc.

In some cases, the ADSC 110 can include a control service 112 configured to control operation of the vehicle propulsion system 130, the braking system 132, the steering system 134, the safety system 136, and the cabin system 138. The control service 112 can receive sensor signals from the sensors 104-108 can communicate with other services of the ADSC 110 to effectuate operation of the autonomous vehicle 102. In some examples, control service 112 may carry out operations in concert with one or more other systems of autonomous vehicle 102.

In some cases, the ADSC 110 can also include a constraint service 114 to facilitate safe propulsion of the autonomous vehicle 102. The constraint service 116 includes instructions for activating a constraint based on a rule-based restriction upon operation of the autonomous vehicle 102. For example, the constraint may be a restriction on navigation that is activated in accordance with protocols configured to avoid occupying the same space as other objects, abide by traffic laws, circumvent avoidance areas, etc. In some examples, the constraint service 114 can be part of the control service 112.

The ADSC 110 can also include a communication service 116. The communication service 116 can include software and/or hardware elements for transmitting and receiving signals to and from the remote computing system 150. The communication service 116 can be configured to transmit information wirelessly over a network, for example, through an antenna array or interface that provides cellular (long-term evolution (LTE), $3^{rd}$ Generation (3G), $5^{th}$ Generation (5G), etc.) communication.

In some examples, one or more services of the ADSC 110 are configured to send and receive communications to remote computing system 150 for reporting data for training and evaluating machine learning algorithms, requesting assistance from remote computing system 150 or a human operator via remote computing system 150, software service updates, ridesharing data, etc.

The ADSC 110 can also include a latency service 118. The latency service 118 can utilize timestamps on communications to and from the remote computing system 150 to determine if a communication has been received from the remote computing system 150 in time to be useful. For example, when a service of the ADSC 110 requests feedback from remote computing system 150 on a time-sensitive process, the latency service 118 can determine if a response was timely received from remote computing system 150, as information can quickly become too stale to be actionable. When the latency service 118 determines that a response has not been received within a threshold period of time, the latency service 118 can enable other systems of autonomous vehicle 102 or a passenger to make decisions or provide needed feedback.

The ADSC 110 can also include a user interface service 120 that can communicate with cabin system 138 to provide information or receive information to a human co-pilot or passenger. In some examples, a human co-pilot or passenger can be asked or requested to evaluate and override a constraint from constraint service 114. In other examples, the human co-pilot or passenger may wish to provide an instruction to the autonomous vehicle 102 regarding destinations, requested routes, or other requested operations.

As described above, the remote computing system 150 can be configured to send and receive signals to and from the autonomous vehicle 102. The signals can include, for example and without limitation, data reported for training and evaluating services such as machine learning services, data for requesting assistance from remote computing system 150 or a human operator, software service updates, rideshare data, commands or instructions, statistics, navigation data, vehicle data, etc. The various computing components on the autonomous vehicle generate heat which needs to be managed to prevent failure of the computing systems.

In this disclosure, a "computing system" or the like is discussed as a heat source that will be cooled through the use of a coolant fluid. Feature 152 represents a heat exchanger that can be configured to enable coolant fluid as described below to draw heat away from any one or more of the vehicle components. The heat exchanger 152 can have separate channels for each coolant fluid loop described below. The heat exchanger 152 can also represent multiple heat exchangers for one or more of the components shown, including braking systems or any other heat generation component in the vehicle. Any one or more of the components shown in FIG. 1 can be considered that computing system. For example, a sensor B 106 might generate heat as it is operating to sense a condition in the environment. A heat exchanger can be configured in connection with the sensor 106 to manage the transfer of heat from the sensor to the coolant fluid. A fluid flow through hoses and heat exchangers could also include multiple heat exchanging points, for example, to first gather heat from a sensor 106 and then from the supercomputer 110. The order in which the cooling fluid loop can travel can vary among the different components of the autonomous vehicle. Further any heat-generating component and be included in the coolant fluid loop(s), including brakes, an exhaust system or any other heat-generating component. Each of these and others can each be considered a heat source.

Figure 3:
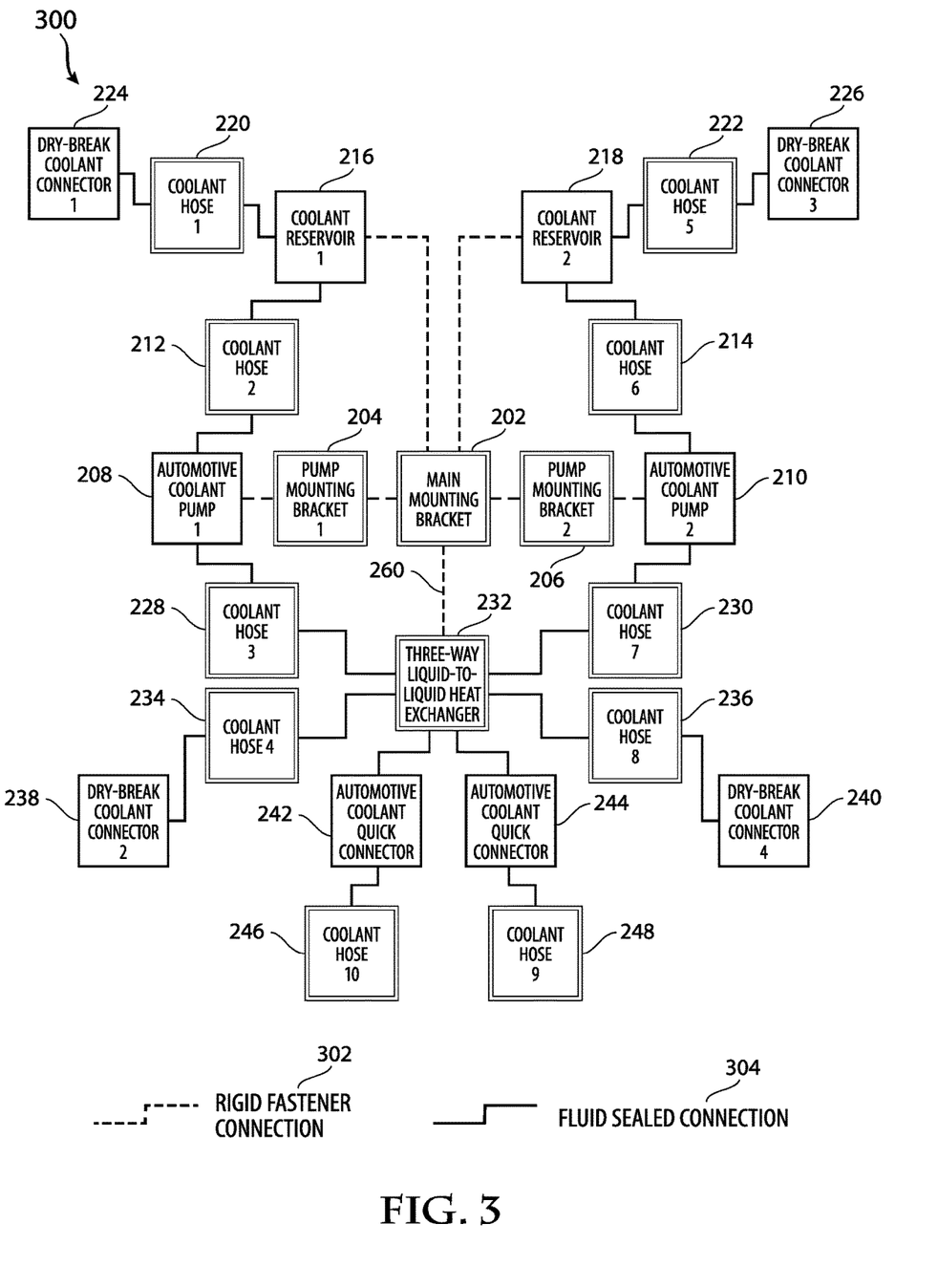
FIG. 3 illustrates a block diagram of the cooling module.
Figure 4:
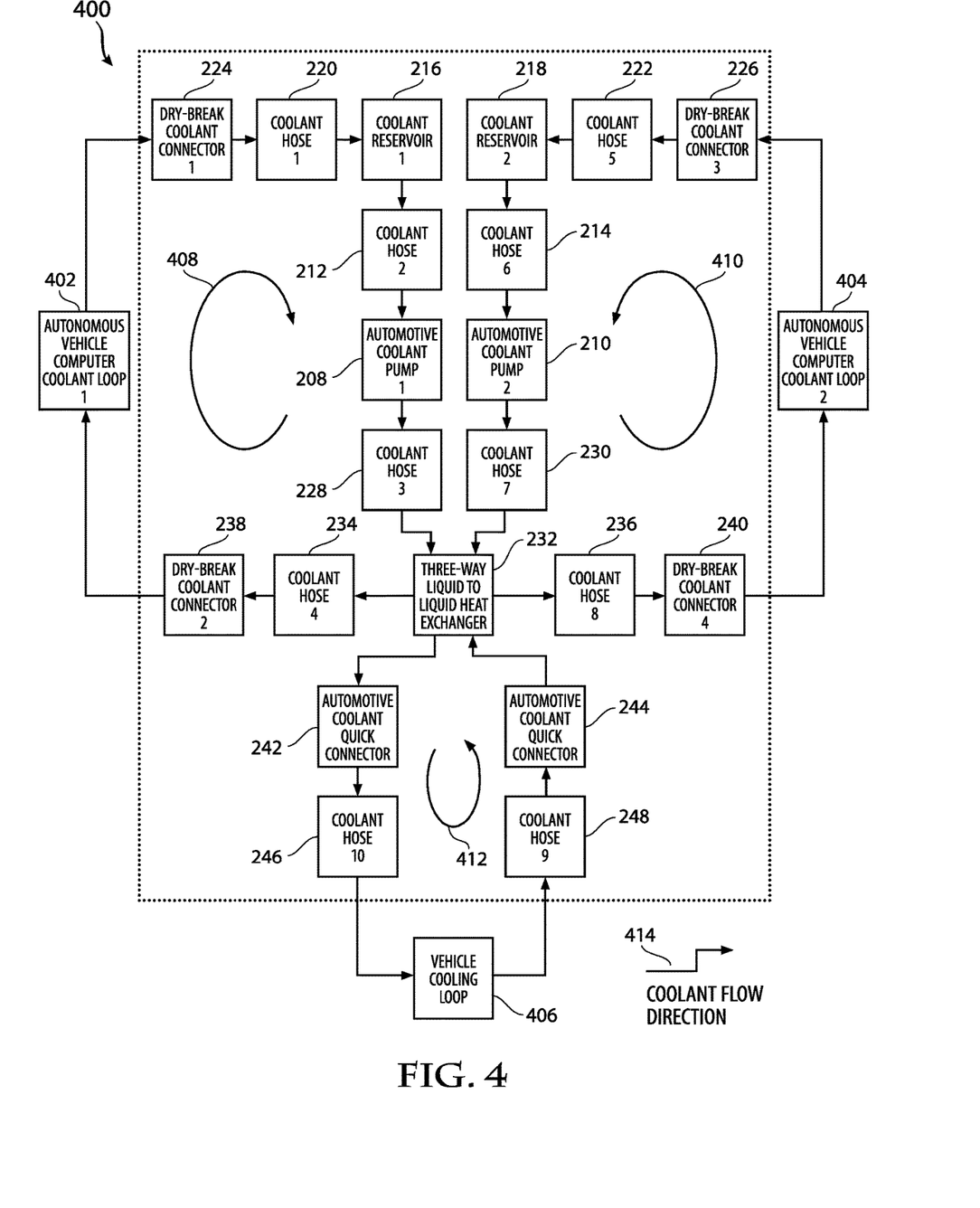
FIG. 4 illustrates a block diagram of the various components and connections of the redundant cooling module including fluid flow indicators.

The novel cooling system is described next with reference to FIGS. 2A, 2B, 3 and 4. The components shown in FIGS. 2A and 2B have corresponding components in FIGS. 3 and 4. FIGS. 3 and 4 are shown in block diagram form but the reference numbers are retained so that the corresponding component can be understood.

Figure 2A:
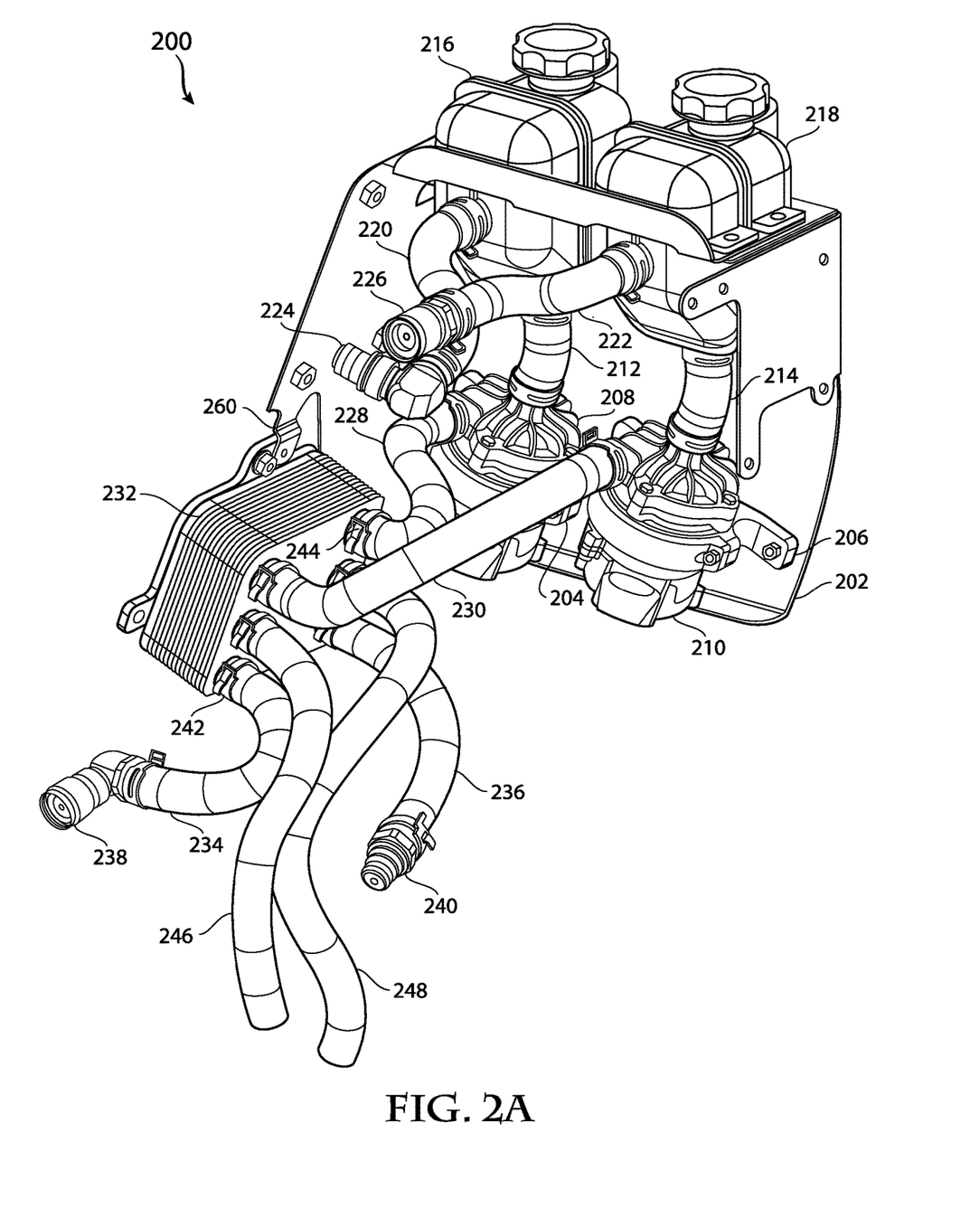
FIG. 2A illustrates the redundant cooling module and its various component.

FIG. 2A shows a dual coolant loop system 200 having a mounting bracket 202 that is designed to secure various components. A pump mounting bracket 204 attaches a first automotive coolant pump 208 to the main mounting bracket 202. A second pump mounting bracket 206 attaches a second automotive coolant pump 210 to the main mounting bracket 202. A coolant hose 212 connects the automotive coolant pump 208 with a coolant reservoir 216. A coolant hose 220 at a first end is connected to the coolant reservoir 216 and at a second end is connected to a dry-break coolant connector 224. The dry-break coolant connector 224 has a structure that enables a component such as the coolant hose 220 and other components to be removed from the coolant loop without the need of draining the fluid from the loop. The above components represent a portion of a first cooling loop 408, as can be shown in FIG. 4.

The coolant reservoir can be an off-the-shelf reservoir used in many vehicles or may be custom made for use in the redundant cooling system. The reservoir stores the coolant fluid and feeds the coolant fluid pumps 208, 210. In another aspect, the coolant fluid reservoir 216 can serve as an air trap system such that bubbles that may form in the coolant fluid as it travels around the coolant loop can rise to the top in the reservoir and thus not be passed with the coolant as it is drawn into the pump 208.

The first cooling loop 408 can include a number of components as shown in the figures. A coolant hose 228 can connect the automotive cooling pump 208 with a three-way liquid-to-liquid heat exchanger 232. The three-way liquid-to-liquid heat exchanger 232 is designed to enable two or more separate coolant fluid loops. FIG. 2C is described below with more details regarding the internal structure of the three-way heat exchanger 232. The three-way exchanger 232 can include a set of aluminum plates that are of a specific form for exchanging heat from the coolant fluid with the outside environment. In one aspect, there are two independent hot-side loops and one independent cold-side loop in the heat exchange configuration. In one aspect, the hose associated with the vehicle engine coolant loop can be the cold side (bringing in cold fluid) and the other hoses associated with the one or more coolant loops for cooling the computer system can be considered the hot side. In this manner, the vehicle engine coolant loop fluid would draw heat from the computer system coolant loop(s) in the heat exchange system 232. A vehicle can have a separate heat exchanger for the engine coolant loop. The separate heat exchanger can draw the heat out of the engine coolant fluid such that the coolant fluid that enters the three-way heat exchanger 232 is cool and used to receive via the three-way heat exchanger 232 the heat from the coolant fluid in the computer system coolant loops. The coolant loop 408 continues with coolant hose 234, dry-break coolant connector 238, the vehicle computer system heat exchanger 402, a dry-break coolant connector 224 and coolant hose 220 which connects to the coolant reservoir 216.

Generally, FIG. 4 shows the solid arrows 414 represent an example of the coolant flow direction. In another aspect, the flows could also be the opposite direction or could otherwise vary.

In another example, assume that the vehicle engine coolant loop 412 includes an independent cooling system, separate from the heat exchanger 232. Since the fluid from the vehicle coolant loop 412 is actually used to cool the hot coolant fluid from the computer system coolant loops (408, 410), the vehicle coolant loop could include processing the coolant fluid through a compressor and/or a chiller (not shown).

The second cooling loop 410 is configured as follows. A second pump mounting bracket 206 attaches in automotive cooling pump 210 to the main mounting bracket 202. A cooling hose 214 connects the automotive coolant fluid pump 210 to a coolant reservoir 218. A coolant hose 222 connects coolant reservoir 218 to a dry-break coolant connector 226. The coolant hose 230 communicates fluid between the automotive coolant pump 210 and the three-way heat exchanger 232. A coolant hose 236 communicates fluid between the three-way heat exchanger 232 and a dry-break coolant connector 240. As is shown in FIG. 4, coolant fluid from the dry-break coolant connector 240 travels to the automotive vehicle computer heat exchanger 404 and then flows to the dry-break coolant connector 226. This flow represents the second redundant coolant flow 410 as shown in FIG. 4.

As shown in FIG. 2A, in automotive coolant quick connector 242 communicates coolant fluid between the three-way heat exchanger 232 and a coolant hose 246. These components are part of the cooling loop between the three-way heat exchanger 232 and the engine represented as feature 406 in FIG. 4. An automotive coolant quick connector 244 communicates liquid between the three-way heat exchanger 232 and coolant hose 248. The heat exchanger in connection with the engine is represented as feature 406 which receives coolant fluid from the coolant hose 246, draws heat away from the engine by heating the coolant fluid and communicating the coolant fluid through hose 248 and automotive coolant quick connector 244 to the three-way heat exchanger 232.

Figure 2B:
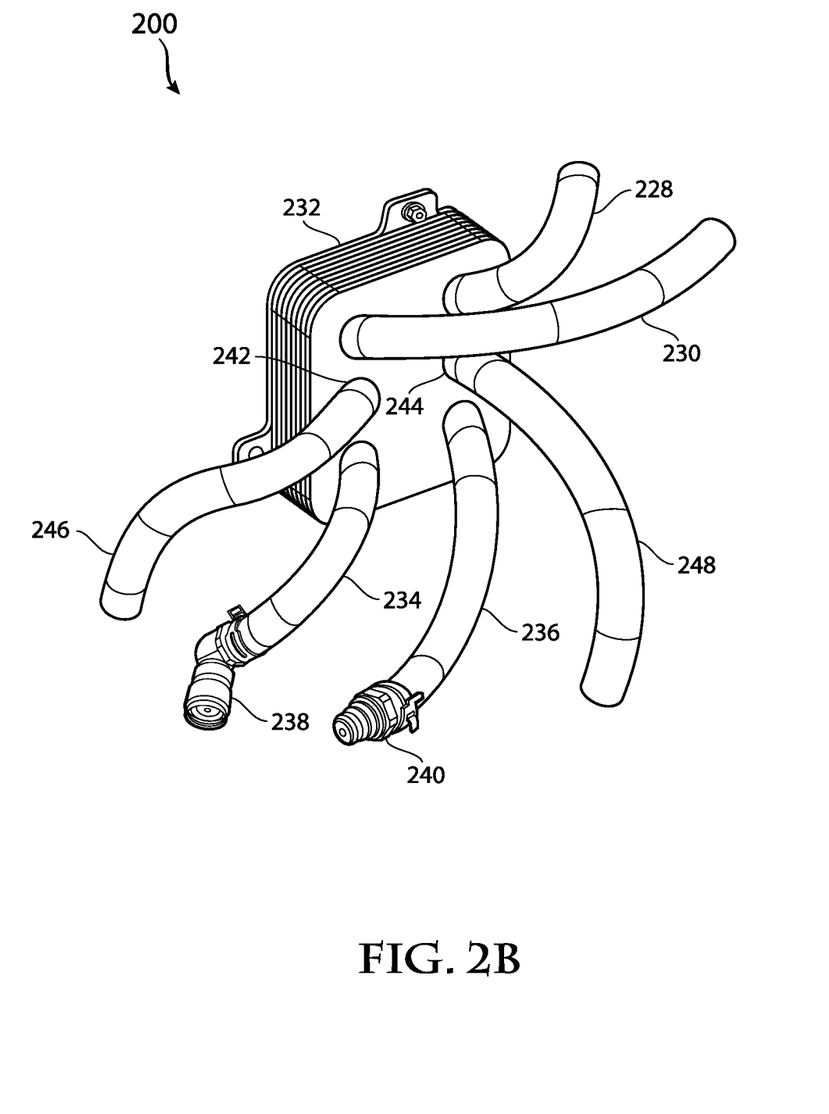
FIG. 2B illustrates the various input and output hoses for the heat exchanger.
Figure 2C:
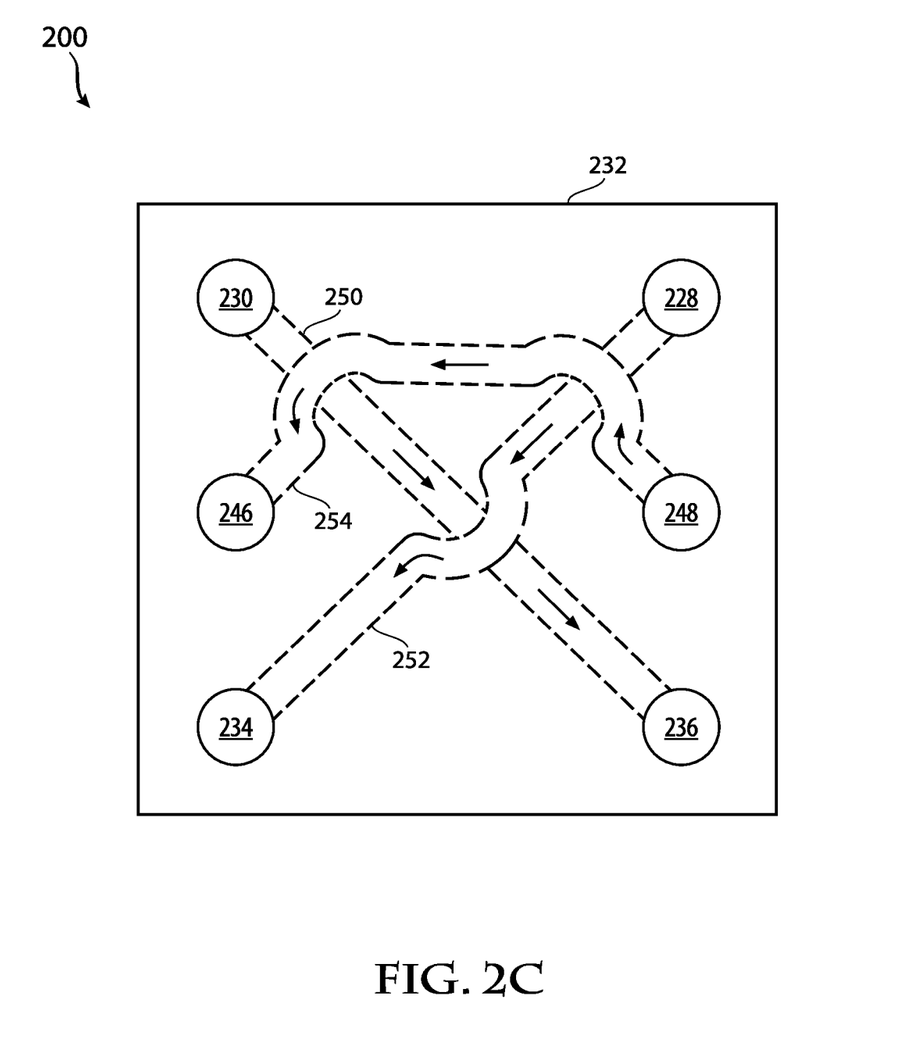
FIG. 2C illustrates example internal details of the heat exchanger.

FIG. 2B illustrates in more detail the hoses connected to the three-way heat exchanger 232. Note that the automotive vehicle first cooling loop represented by coolant hose 328 providing hot coolant fluid to the three-way heat exchanger 232 with coolant hose 234 communicating cooled coolant fluid through the dry-break coolant connector 238 to the autonomous vehicle computer heat exchanger 402. The second automotive cooling loop 410 is shown with coolant hose 230 providing hot coolant fluid to the three-way heat exchanger 232, which cools the fluid. The cooled fluid flows through coolant hose 236 through the dry-break coolant connector 240 to the autonomous vehicle computer system heat exchanger 404 that heats up the coolant fluid. The heated coolant fluid flows through the dry-break coolant connector 226 through the coolant hose 222 to the coolant reservoir 218.

In another aspect, the component 402 and 404 could represent separate heat exchanger from two redundant and separate computing systems, or could represent two sub-components or heat-exchangers for a single computing system but that has different parts which generate heat, such as two different processors.

Also shown in FIG. 2B is the coolant hose 246 which communicates coolant liquid to the vehicle engine heat exchanger 406 which heats the coolant liquid and provides the heated liquid through coolant hose 248 to the three-way heat exchanger 232 thus completing the vehicle engine cooling loop 412. A noted above, in one aspect, the coolant liquid in hose 248 is cooled and used to draw heat away from coolant loops 408, 410. In another aspect, loop 212 includes a chiller or other component that cools the coolant fluid from the engine of the vehicle such that the coolant liquid is in a cooled state entering the heat exchanger 232.

FIG. 2C illustrates an example internal structure of the heat exchanger 232. The structure of the heat exchanger enables both the transfer of heat to or from a respective coolant fluid and maintains separate coolant fluid loops for the at least two loops. Loop 408 is represented by input hose 228 in which coolant fluid travels through a channel 252 through the heat exchanger 232 to exit hose 234. Loop 410 is represented by input hose 230 carrying its respective coolant fluid through channel 250 to exit hose 236. Note that these channels 252, 250 are shown as not intersecting or combining. These two loops 408, 410 are part of the coolant system for the vehicle computer system. An optional loop 412 can also be included and which is represented by input hose 248, channel 254 and output hose 246. Loop 412 can be associated with the engine of the autonomous vehicle. Loop 412 can either be used to cool the respective coolant fluid via the heat exchanger 232, or can be used to draw heat from the coolant fluid from one or both of loops 408, 410 and into the coolant fluid from loop 412. If the coolant fluid in loop 412 is input to the heat exchanger 232 in a cooled state with the purpose of receiving a transfer of heat, then that coolant fluid would have been separately cooled or chilled prior to entering the heat exchanger 232. This disclosure covers both scenarios of the engine coolant fluid being cooled or heated in the heat exchanger 232. As noted above, the engine cooling loop 412 may also be completely separate and not interact with the heat exchanger 232 as well.

FIG. 3 illustrates the various pathways for coolant fluid and the physical connection of the components to a mounting bracket 202. The dotted line 302 represents a rigid fastener connection of a respective component to the main mounting bracket 202. The coolant reservoirs 216, 218 are attached to the bracket 202. A pump mounting bracket 204 attaches the coolant pump 208 to the mounting bracket 202. A pump mounting bracket 206 attaches a second coolant pump 210 to the main mounting bracket 202. The three-way liquid-to-liquid heat exchanger 232 is also mounted via a rigid connector to the mounting bracket 202. The solid lines 304 in FIG. 3 represent a sealed connection which allows coolant flow between components.

The system 300 also illustrates with a double framework the specific components that are novel to the cooling system 300. For example, coolant hoses 220, 222, 212, 214 have a double framing that indicates it is a new feature in the cooling system 300. As shown, some of the components are similar to what is illustrated in FIG. 4. Coolant loop 408 from FIG. 4 is shown in FIG. 3 input hose 228 in which coolant fluid travels through a channel 252 through the heat exchanger 232 to exit hose 234. The coolant is communicated through a dry-break coolant connector 238 to the computer system (not shown in FIG. 3) for drawing away heat. The heated coolant fluid from the computer flows through the dry-break coolant connector 224 through a coolant hose 220 to a coolant reservoir 216. The coolant hose 212 communicates the fluid from the reservoir to the coolant pump 208 and then to the coolant hose 228 to complete loop 408.

Loop 410 from FIG. 4 is represented in FIG. 3 by input hose 230 carrying its respective coolant fluid through a channel in the heat exchanger 232 to exit hose 236. A dry-break coolant connector 240 communicates the fluid to the computer system (not shown). The heated fluid returns through the dry-break coolant connector 226 through a hose 222 to the coolant reservoir 218. The coolant is drawn from the reservoir 218 through a coolant hose 214 by the coolant pump 210 and into hose 230 to complete loop 410.

The automatic vehicle engine coolant loop 412 is shown with the coolant hose 248 carrying coolant fluid from the vehicle engine (not shown) through a coolant quick connector 244 to the heat exchanger 232, and out to the coolant quick connector 242 through the coolant hose 246 to the vehicle engine.

Figure 5:
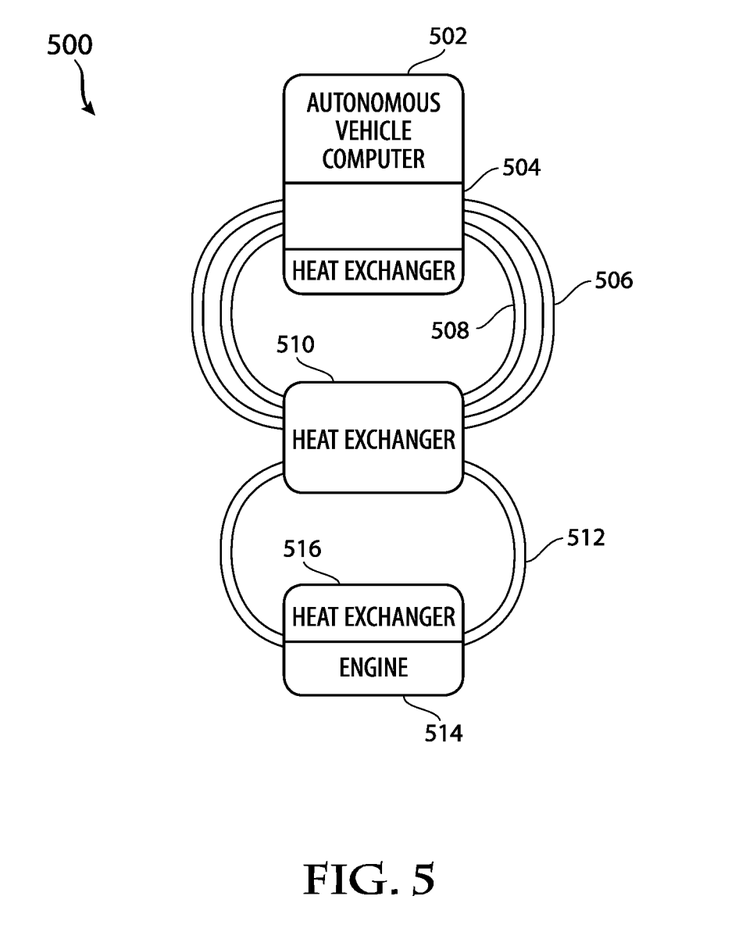
FIG. 5 illustrates the redundant coolant loop between the computer system, the three-way heat exchanger and the engine.

FIG. 5 provides a simplified version 500 of the double coolant fluid loop between the three-way heat exchanger 510 and the autonomous vehicle computer heat exchange system 504. The autonomous vehicle computer 502 is shown as well. A first loop 506 is illustrated as well as a second loop 508. The redundancy aspect of this disclosure enables calling fluid to be provided to the automotive vehicle computer system 502 to be communicated through its heat exchanger 504 such that even if there is a blockage or problem with one of the coolant fluid loops 506, 508, the other fluid loop would be operational thus enabling the autonomous vehicle computer system 502 to continue to operate and to be property cooled.

Also shown in FIG. 5 is the vehicle engine coolant loop 512 that communicates coolant fluid between the heat exchanger 510 and heat exchanger 516 associate with the engine 514. It is noted that while the engine 514 is represented, other components of the vehicle might also generate heat and be part of this coolant loop 512.

Figure 6:
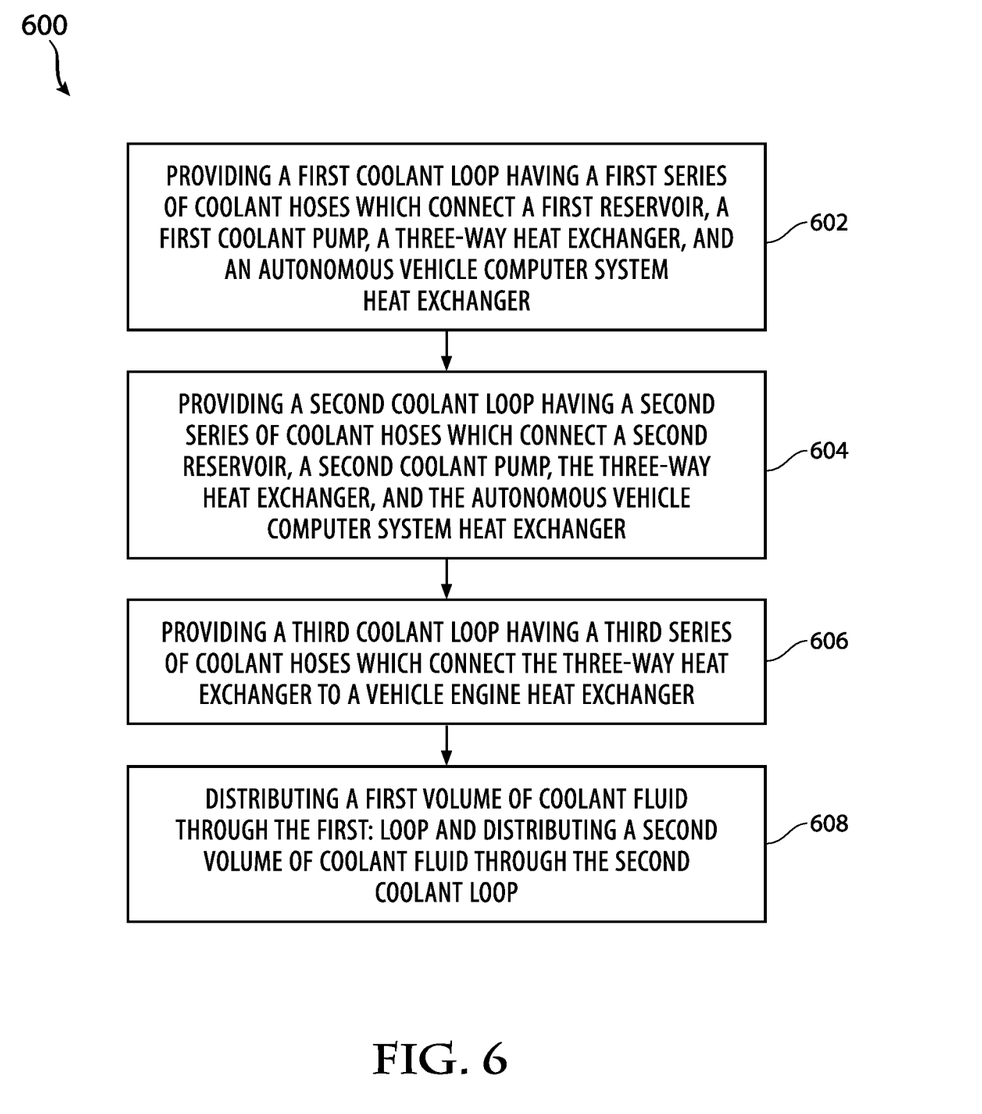
FIG. 6 illustrates an example method embodiment.

FIG. 6 illustrates a method aspect of this disclosure. An example method includes providing a first coolant loop having a first series of coolant hoses which connect a first reservoir, a first coolant pump, a three-way heat exchanger, and an autonomous vehicle computer system heat exchanger (602), providing a second coolant loop having a second series of coolant hoses which connect a second reservoir, a second coolant pump, the three-way heat exchanger, and the autonomous vehicle computer system heat exchanger (604), providing a third coolant loop having a third series of coolant hoses which connect the three-way heat exchanger to a vehicle engine heat exchanger (606). The method can include distributing a first volume of coolant fluid through the first coolant loop and distributing a second volume of coolant fluid through the second coolant loop (608). The first coolant loop and the second coolant loop are independent of each other such that of one of the first coolant loop or the second coolant loop fails for some reason such as a leak occurs or a blockage occurs, the remaining coolant loop can continue to function to provide the cooling service to the autonomous vehicle computer system heat exchanger.

In another aspect, the three-way heat exchanger 232 could be reconfigured such that the vehicle coolant loop 412 is removed and the heat exchanger 232 only processes the coolant fluid from the coolant fluid loops 408, 410. In this aspect, the heat exchanger 232 can passively draw heat from the coolant fluid or could including a chilling component to cool the working fluid.

Figure 7:
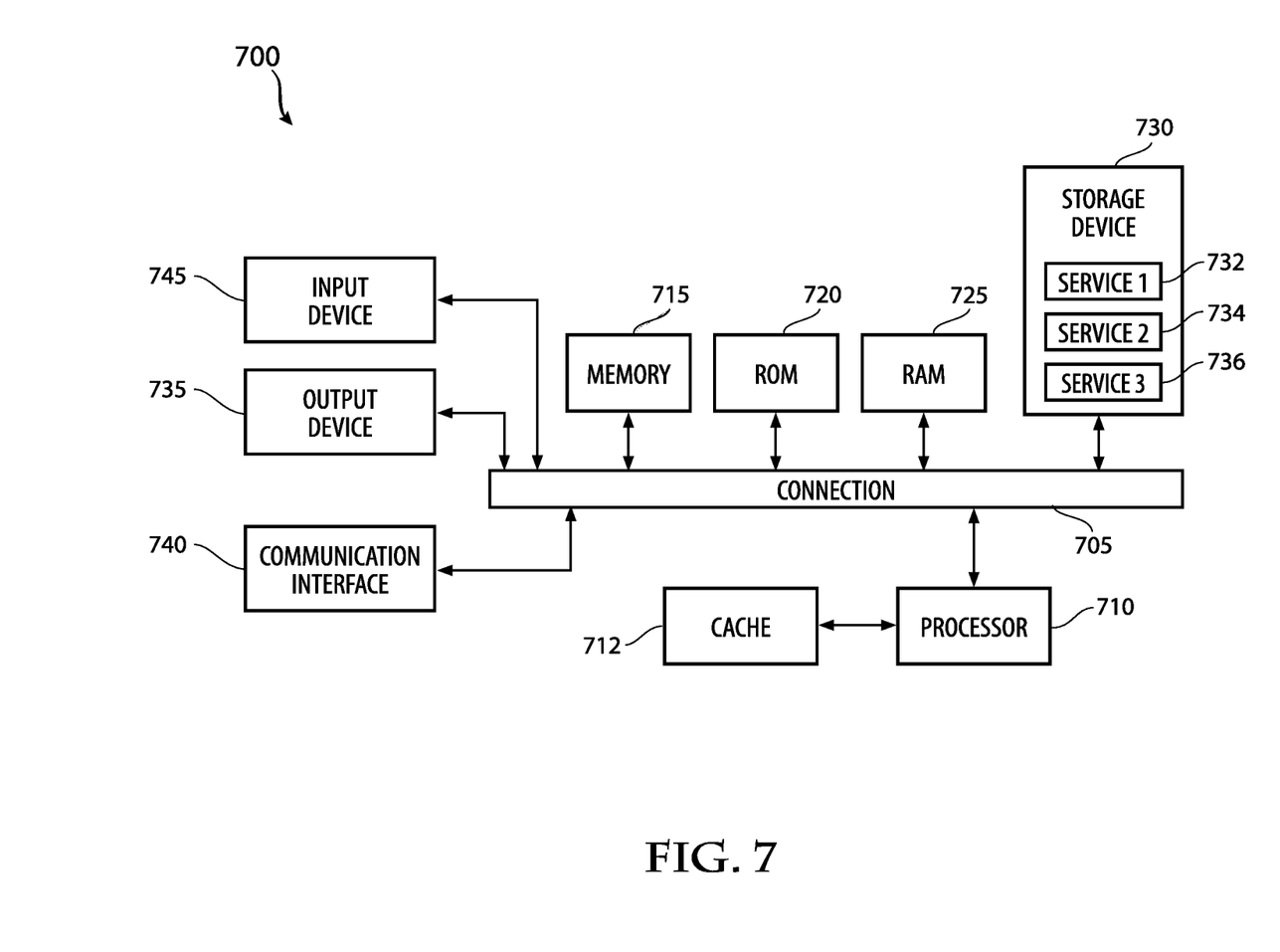
FIG. 7 illustrate another example method.

FIG. 7 illustrates example computer device that can be used in connection with any of the systems disclosed herein. In this example, FIG. 7 illustrates a computing system 700 including components in electrical communication with each other using a connection 705, such as a bus. System 700 includes a processing unit (CPU or processor) 710 and a system connection 705 that couples various system components including the system memory 715, such as read only memory (ROM) 720 and random access memory (RAM) 725, to the processor 710. The system 700 can include a cache of high-speed memory connected directly with, in close proximity to, or integrated as part of the processor 710. The system 700 can copy data from the memory 715 and/or the storage device 730 to the cache 712 for quick access by the processor 710. In this way, the cache can provide a performance boost that avoids processor 710 delays while waiting for data. These and other modules can control or be configured to control the processor 710 to perform various actions. Other system memory 715 may be available for use as well. The memory 715 can include multiple different types of memory with different performance characteristics. The processor 710 can include any general purpose processor and a hardware or software service, such as service (or module) 1 732, service (or module) 2 734, and service (or module) 3 736 stored in storage device 730, configured to control the processor 710 as well as a special-purpose processor where software instructions are incorporated into the actual processor design. The processor 710 may be a completely self-contained computing system, containing multiple cores or processors, a bus, memory controller, cache, etc. A multi-core processor may be symmetric or asymmetric.

To enable user interaction with the device 700, an input device 745 can represent any number of input mechanisms, such as a microphone for speech, a touch-sensitive screen for gesture or graphical input, keyboard, mouse, motion input, speech and so forth. An output device 735 can also be one or more of a number of output mechanisms known to those of skill in the art. In some instances, multimodal systems can enable a user to provide multiple types of input to communicate with the device 700. The communications interface 740 can generally govern and manage the user input and system output. There is no restriction on operating on any particular hardware arrangement and therefore the basic features here may easily be substituted for improved hardware or firmware arrangements as they are developed.

Storage device 730 is a non-volatile memory and can be a hard disk or other types of computer readable media which can store data that are accessible by a computer, such as magnetic cassettes, flash memory cards, solid state memory devices, digital versatile disks, cartridges, random access memories (RAMs) 725, read only memory (ROM) 720, and hybrids thereof.

The storage device 730 can include services 732, 734, 736 for controlling the processor 710. Other hardware or software modules are contemplated. The storage device 730 can be connected to the system connection 705. In one aspect, a hardware module that performs a particular function can include the software component stored in a computer-readable medium in connection with the necessary hardware components, such as the processor 710, connection 705, output device 735, and so forth, to carry out the function.

In some embodiments the computer-readable storage devices, mediums, and memories can include a cable or wireless signal containing a bit stream and the like. However, when mentioned, non-transitory computer-readable storage media expressly exclude media such as energy, carrier signals, electromagnetic waves, and signals per se.

Methods according to the above-described examples can be implemented using computer-executable instructions that are stored or otherwise available from computer readable media. Such instructions can comprise, for example, instructions and data which cause or otherwise configure a general purpose computer, special purpose computer, or special purpose processing device to perform a certain function or group of functions. Portions of computer resources used can be accessible over a network. The computer executable instructions may be, for example, binaries, intermediate format instructions such as assembly language, firmware, or source code. Examples of computer-readable media that may be used to store instructions, information used, and/or information created during methods according to described examples include magnetic or optical disks, flash memory, USB devices provided with non-volatile memory, networked storage devices, and so on.

Devices implementing methods according to these disclosures can comprise hardware, firmware and/or software, and can take any of a variety of form factors.

The instructions, media for conveying such instructions, computing resources for executing them, and other structures for supporting such computing resources are means for providing the functions described in these disclosures.

Although a variety of examples and other information were used to explain aspects within the scope of the appended claims, no limitation of the claims should be implied based on particular features or arrangements in such examples, as one of ordinary skill would be able to use these examples to derive a wide variety of implementations. Further and although some subject matter may have been described in language specific to examples of structural features and/or method steps, it is to be understood that the subject matter defined in the appended claims is not necessarily limited to these described features or acts. For example, such functionality can be distributed differently or performed in components other than those identified herein. Rather, the described features and steps are disclosed as examples of components of systems and methods within the scope of the appended claims.

Claim language reciting "at least one of" refers to at least one of a set and indicates that one member of the set or multiple members of the set satisfy the claim. For example, claim language reciting "at least one of A and B" means A, B, or A and B.

What is claimed is:

1. A three-way heat exchanger comprising:
one or more first internal channels connected to a first coolant loop configured to communicate a first volume of coolant fluid between the three-way heat exchanger and a computer system heat exchanger;
one or more second internal channels connected to a second coolant loop configured to communicate a second volume of coolant fluid between the three-way heat exchanger and the computer system heat exchanger; and one or more third internal channels connected to a third coolant loop configured to communicate a third volume of coolant fluid between the three-way heat exchanger and an engine heat exchanger.

2. The three-way heat exchanger of claim 1, wherein the three-way heat exchanger is configured such that the first volume of coolant fluid and the second volume of coolant fluid are each separately cooled in the three-way heat exchanger.

3. The three-way heat exchanger of claim 1, wherein the computer system heat exchanger is associated with a computer system of an autonomous vehicle, and wherein the engine heat exchanger is associated with the autonomous vehicle.

4. The three-way heat exchanger of claim 1, wherein the third coolant loop comprises a vehicle engine coolant loop of an autonomous vehicle, and wherein the engine heat exchanger is associated with the vehicle engine coolant loop.

5. The three-way heat exchanger of claim 1, wherein the first coolant loop comprises a hot-side loop and the second coolant loop comprises a separate hot-side loop, and wherein the third coolant loop comprises a cold-side loop.

6. The three-way heat exchanger of claim 1, wherein the three-way heat exchanger is configured to cool, using the third volume of coolant fluid, at least one of the first volume of coolant fluid and the second volume of coolant fluid.

7. The three-way heat exchanger of claim 1, wherein the one or more first internal channels connected to the first coolant loop communicate the first volume of coolant fluid independent from the one or more second internal channels connected to the second coolant loop that communicate the second volume of coolant fluid.

8. The three-way heat exchanger of claim 1, wherein when the first coolant loop fails, the three-way heat exchanger continues to draw heat from a computer system via at least one of the second coolant loop and the third coolant loop.

9. The three-way heat exchanger of claim 1, wherein the three-way heat exchanger is part of a redundant thermal management system which provides multiple independent flows of coolant fluid to a computer system in thermal communication with the computer system heat exchanger.

10. A method comprising:
providing, by a three-way heat exchanger, one or more first internal channels connected to a first coolant loop configured to communicate a first volume of coolant fluid between the three-way heat exchanger and a computer system heat exchanger;
providing, by the three-way heat exchanger, one or more second internal channels connected to a second coolant loop configured to communicate a second volume of coolant fluid between the three-way heat exchanger and the computer system heat exchanger;
providing, by the three-way heat exchanger, one or more third internal channels connected to a third coolant loop configured to communicate a third volume of coolant fluid between the three-way heat exchanger and an engine heat exchanger; and
distributing, by the three-way heat exchanger, the first volume of coolant fluid through the one or more first internal channels, the second volume of coolant fluid through the one or more second internal channels, and the third volume of coolant fluid through the one or more third internal channels.

11. The method of claim 10, wherein the three-way heat exchanger is configured such that the first volume of coolant fluid and the second volume of coolant fluid are each separately cooled in the three-way heat exchanger.

12. The method of claim 10, wherein the computer system heat exchanger is associated with a computer system of an autonomous vehicle, and wherein the engine heat exchanger is associated with the autonomous vehicle.

13. The method of claim 10, wherein the third coolant loop comprises a vehicle engine coolant loop of an autonomous vehicle, and wherein the engine heat exchanger is associated with the vehicle engine coolant loop.

14. The method of claim 10, wherein the first coolant loop comprises a hot-side loop and the second coolant loop comprises a separate hot-side loop, and wherein the third coolant loop comprises a cold-side loop.

15. The method of claim 10, further comprising cooling, via the three-way heat exchanger using the third volume of coolant fluid, at least one of the first volume of coolant fluid and the second volume of coolant fluid.

16. The method of claim 10, wherein the one or more first internal channels connected to the first coolant loop communicate the first volume of coolant fluid independent from the one or more second internal channels connected to the second coolant loop that communicate the second volume of coolant fluid.

17. The method of claim 10, wherein when the first coolant loop fails, the three-way heat exchanger continues to draw heat from a computer system via at least one of the second coolant loop and the third coolant loop.

18. The method of claim 10, wherein the three-way heat exchanger is part of a redundant thermal management system which provides multiple independent flows of coolant fluid to a computer system in thermal communication with the computer system heat exchanger.

19. A computer system comprising:
one or more processors; and
a three-way heat exchanger comprising:
one or more first internal channels connected to a first coolant loop configured to communicate a first volume of coolant fluid between the three-way heat exchanger and a computer system heat exchanger;
one or more second internal channels connected to a second coolant loop configured to communicate a second volume of coolant fluid between the three-way heat exchanger and the computer system heat exchanger; and
one or more third internal channels connected to a third coolant loop configured to communicate a third volume of coolant fluid between the three-way heat exchanger and an engine heat exchanger.

20. The computer system of claim 19, wherein the computer system is part of an autonomous vehicle, and wherein the three-way heat exchanger is configured such that the first volume of coolant fluid and the second volume of coolant fluid are each separately cooled in the three-way heat exchanger.

* * * * *